US009977061B2

(12) United States Patent
Suwald

(10) Patent No.: US 9,977,061 B2
(45) Date of Patent: May 22, 2018

(54) CAPACITIVE POSITION SENSOR SYSTEM

(71) Applicant: NXP B.V., Eindhoven (NL)

(72) Inventor: Thomas Suwald, Hamburg (DE)

(73) Assignee: NXP B.V., Eindhoven (NL)

( * ) Notice: Subject to any disclaimer, the term of this patent is extended or adjusted under 35 U.S.C. 154(b) by 609 days.

(21) Appl. No.: 14/038,554

(22) Filed: Sep. 26, 2013

(65) Prior Publication Data

US 2014/0091815 A1 Apr. 3, 2014

(30) Foreign Application Priority Data

Oct. 2, 2012 (EP) .................................. 12187015

(51) Int. Cl.
*G01R 27/26* (2006.01)
*G06F 3/044* (2006.01)

(52) U.S. Cl.
CPC ......... *G01R 27/2605* (2013.01); *G06F 3/044* (2013.01)

(58) Field of Classification Search
CPC .......... G01R 27/26; G06F 3/041; G06F 3/044
USPC .................. 324/658; 345/173, 174
See application file for complete search history.

(56) References Cited

U.S. PATENT DOCUMENTS

| 4,441,082 | A | 4/1984 | Haque |
|---|---|---|---|
| 4,495,485 | A | 1/1985 | Smith |
| 4,894,620 | A | 1/1990 | Nagaraj |
| 5,730,165 | A | 3/1998 | Philipp |
| 6,466,036 | B1 | 10/2002 | Philipp |
| 7,375,535 | B1 | 5/2008 | Kutz et al. |
| 8,095,091 | B1 | 1/2012 | Kopikare |
| 2002/0030666 | A1 | 3/2002 | Philipp |
| 2003/0132764 | A1 | 7/2003 | Fasen |

(Continued)

FOREIGN PATENT DOCUMENTS

| EP | 0 093 565 A2 | 11/1983 |
|---|---|---|
| EP | 1 548 409 A1 | 6/2005 |

(Continued)

OTHER PUBLICATIONS

Gregorian, R. et al. "Switched-Capacitor Circuit Design", Proceedings of the IEEE, vol. 71, No. 8, pp. 941-966 (Aug. 1983).

(Continued)

*Primary Examiner* — Minh Phan
*Assistant Examiner* — Zannatul Ferdous

(57) ABSTRACT

A capacitive position sensor system for determining the position of an object, in particular on a surface of a contactless smartcard, is provided. The object is positioned within a sensitive area of the capacitive position sensor system and changes the capacitance of capacitors being arranged underneath the object. The capacitive position sensor system comprises a set of sensing elements being arranged in the form of a column. Each sensing element includes a first capacitor having a first electrode and a second electrode and a second capacitor having a first electrode and a second electrode. A specific weighting factor is assigned to each capacitor. A control unit is adapted to determine the position of the object in one dimension by analyzing the results of a plurality of sensed voltage levels for the first capacitors and the second capacitors of a plurality of integration cycles.

14 Claims, 11 Drawing Sheets

(56) References Cited

U.S. PATENT DOCUMENTS

| | | | |
|---|---|---|---|
| 2010/0045632 A1* | 2/2010 | Yilmaz | G01D 5/2405 345/174 |
| 2010/0066692 A1* | 3/2010 | Noguchi | G06F 3/0412 345/173 |
| 2010/0156839 A1 | 6/2010 | Ellis | |
| 2010/0289772 A1 | 11/2010 | Miller | |
| 2010/0315363 A1 | 12/2010 | Kobayashi et al. | |
| 2010/0328228 A1* | 12/2010 | Elias | G06F 3/044 345/173 |
| 2010/0328241 A1* | 12/2010 | Paulsen | G06F 3/044 345/173 |
| 2011/0082390 A1 | 4/2011 | Krieter et al. | |
| 2011/0193817 A1 | 8/2011 | Byun et al. | |
| 2011/0227865 A1 | 9/2011 | Baek | |
| 2011/0273400 A1* | 11/2011 | Kwon | G06F 3/0416 345/174 |
| 2011/0310025 A1* | 12/2011 | Simmons | G06F 3/0416 345/173 |
| 2013/0086389 A1 | 4/2013 | Suwald | |
| 2013/0106762 A1* | 5/2013 | Shahparnia | G06F 3/03545 345/174 |
| 2013/0285966 A1* | 10/2013 | Kimura | G06F 3/0412 345/173 |
| 2014/0152610 A1 | 6/2014 | Suwald | |

FOREIGN PATENT DOCUMENTS

| | | |
|---|---|---|
| EP | 1 978 642 A2 | 10/2008 |
| WO | 2004/040240 A1 | 5/2004 |
| WO | 2007/135663 A1 | 11/2007 |

OTHER PUBLICATIONS

Extended European Search Report for Patent Appln. No. 12187015.8 (dated Mar. 20, 2013).

"QMatrix QT60040 4-Key Charge-Transfer IC", Quantum Research Group Ltd, 10 pgs retrieved from the internet at: home.comcast.net/~rfpowerdude/MegaSquirt/QT60040.pdf (2000).

"QSlide, 16-Key QMatrix Sensor IC AT42QT2160", Atmel, 49 pgs retrieved from the internet at: www.atmel.com/Images/AT42QT2160_DS.pdf (2008).

Extended European Search Report for Patent Appln. No. 12169581.1 (Oct. 16, 2012).

* cited by examiner

| STEP | S11H | S11L | S12H | S12L | S13H | S13L | S2H | S2L | S3H | S3L | FUNCTION |
|---|---|---|---|---|---|---|---|---|---|---|---|
| A | X | -- | X | -- | X | -- | -- | X | -- | X | Reset CsiCsjCNT |
| B | X | -- | X | -- | X | -- | -- | X | -- | X | Reset Cint |
| C | -- | X | X | -- | X | -- | X | -- | -- | -- | Reset Csi, Csj |
| D | -- | X | X | -- | X | -- | -- | -- | -- | -- | Disconnect Node Z |
| E | -- | X | X | -- | X | -- | -- | -- | -- | X | Charge Cint |
| F | -- | X | -- | X | -- | X | -- | -- | -- | X | Reverse Ci, Cj |
| G | -- | X | -- | X | -- | X | -- | -- | -- | X | Measure Cint |
| H | -- | X | -- | X | -- | X | -- | -- | -- | -- | Disconnect Cint |
| J | -- | X | -- | X | -- | X | -- | -- | -- | -- | Increase CsiCsjCNT |
| K | -- | X | -- | X | -- | X | -- | -- | -- | -- | READ CsiCsjCNT |

Steps C through J form a LOOP.

$i, j \in \{1,2,3\}$

CAPACITIVE POSITION SENSOR SYSTEM

CROSS-REFERENCE TO RELATED APPLICATIONS

This application claims the priority under 35 U.S.C. § 119 of European patent application no. 12187015.8, filed on Oct. 2, 2012, the contents of which are incorporated by reference herein.

FIELD OF THE INVENTION

The invention relates to a capacitive position sensor system for determining the position of an object, in particular on a contactless smartcard, in particular for recognition of handwritten characters.

Beyond this, the invention relates to an electronic device.

Furthermore, the invention relates to a method of determining the position of an object, in particular on a contactless smartcard.

Moreover, the invention relates to a computer-readable medium.

Beyond this, the invention relates to a program element.

BACKGROUND OF THE INVENTION

Many modern consumer devices require comfortable user data entry and proximity sensing interfaces which became very popular in devices like smart phones and portable media players. The measurement principles applied in position sensing are many-fold. The following measurement principles are commonly applied: Capacitive Proximity Position Sensors, Resistive Position Sensors, Optical Position Sensors and Acoustical Position Sensors.

The first two principles are the most popular ones and cover in total more than 90% of all position sensing applications. The measurement of touch dependent resistances and proximity dependent capacitances is utilized to obtain the position information by numerical post-processing. An integrator circuit is used to transform a resistance or a capacitance into timing information that can be captured by a microcontroller unit (MCU). The integrator is stimulated by an input signal and the resulting response is sampled and hold and evaluated by an MCU. Another common approach is to use a constant current to charge a capacitor under test and measure the time required to charge the capacitor to a predefined voltage. After the measurement, the capacitor is reset by a reset signal and a new charging cycle can be started. Another common method for capacitance measurement is to use a capacitor under test as timing element in a relaxation oscillator, resulting in a capacitance to frequency conversion. The resulting frequency is measured by a frequency measurement routine executed on a MCU.

A common capacitance measurement method is to use the capacitor under test as a frequency dependent resistor charging an integration capacitor in a switched capacitor integrator configuration. The basic principle is well known and documented, e.g., in the publications: Switched-Capacitor Circuit Design, R. Gregorian, et al, Proceedings of the IEEE, Vol 71, No. 8, August 1983 and Switched-Capacitor Circuit with Large Time Constant, Krishnaswamy Nagaraj, U.S. Pat. No. 4,894,620, Jan. 16, 1990.

When operating a prior art capacitive proximity sensor in a contactless smartcard the sensitivity of the sensor degrades significantly due to the extremely poor coupling between real earth ground potential and the smartcard's circuit ground potential. The poor ground connection results in a reduced sensitivity that does not allow implementing a 2-dimensional sensors for online-handwriting recognition systems in a contactless smartcard system.

When operating a prior art proximity sensor based on a plurality of individual sensors utilized to obtain a position by applying a center of gravity algorithm on the individual sensor's activity levels so called ghost positions are identified that appear due to a combination of random noise and the nature of the center of gravity algorithm. These ghost positions reduce the position quality such that it may cause false signal processing in i.e. a handwritten character recognition algorithm.

When operating a prior art proximity sensor based on a plurality of individual sensors in a contactless smartcard the poor sensor sensitivity may be improved by extending the integration interval. Prior art proposes to increase the integration capacitor. Increasing the integration capacitor extends the measurement time and consequently reduces the amount of measurements that can be executed within one second. The amount of measurements that can be achieved within one second according to the prior art proposal is too small for a proper detection of handwritten characters.

When operating a prior art proximity sensor based on a plurality of individual sensors only one sensor is measured at a time which reduces the total effective sensor area to the size of an individual sensor. Noise picked up by that sensor has a relative large impact on the sensor signal.

OBJECT AND SUMMARY OF THE INVENTION

It is an object of the invention to provide a capacitive position sensor system or method for providing an efficient way of determining the position of an object, in particular on a contactless smartcard, avoiding the above mentioned disadvantages.

In order to achieve the object defined above, a capacitive position sensor system, an electronic device, a determination method, a computer-readable medium and a program element according to the independent claims are provided.

According to an exemplary embodiment of the invention, a capacitive position sensor system for determining the position of an object, in particular on a surface of a contactless smartcard, is provided. The object is positioned within a sensitive area of the capacitive position sensor system and changes the capacitance of capacitors being arranged underneath the object. The capacitive position sensor system comprises a set of sensing elements being arranged in the form of a column, each sensing element comprising a first capacitor having a first electrode and a second electrode and a second capacitor having a first electrode and a second electrode, wherein each first electrode is coupled via a switch to a voltage supply to form a switched capacitor filter, wherein the second electrodes of the first capacitors are coupled to form a first sensing line and the second electrodes of the second capacitors are coupled to form a second sensing line, a sensing unit, wherein the sensing unit is adapted to sense a voltage level representing the amount of charge being present on the first sensing line and the second sensing line, and a control unit, wherein the control unit is adapted to apply a drive signal to each of the switches being coupled to the first electrodes, wherein a specific weighting factor is assigned to each capacitor, wherein the capacitances of the first and the second capacitor of one sensing element corresponds to a constant capacitance value, wherein, in one integration cycle, a part of the switches being coupled to the first electrodes is closed so that a part of the first capacitors is driven by a first drive signal and a part of the switches being coupled to the second electrodes is closed so that a part of the second capacitors is driven by a second drive signal, wherein the sensing unit is adapted to sense the voltage level representing the sum of the amount of charge of the part of the first capacitors and the voltage level representing the sum of the amount of charge of the part of the second capacitors, wherein the control unit is adapted to determine the position of the object in one dimension by analyzing the results of a plurality of sensed voltage levels for the first capacitors and the second capacitors of a plurality of integration cycles.

According to a further exemplary embodiment, an electronic device for receiving an input from a user is provided. The electronic device comprises the capacitive position sensor system having the above mentioned features, wherein the input corresponds to the positioning of an object of the user.

According to a further exemplary embodiment, a method of determining the position of an object, in particular on a surface of a contactless smartcard, is provided, wherein the object is positioned within a sensitive area of a capacitive position sensor system and changes the capacitance of capacitors being arranged underneath the object. The capacitive position sensor system comprises a set of sensing elements being arranged in the form of a column, each sensing element comprising a first capacitor having a first electrode and a second electrode and a second capacitor having a first electrode and a second electrode, wherein each first electrode is coupled via a switch to a voltage supply to form a switched capacitor filter, wherein the second electrodes of the first capacitors are coupled to form a first sensing line and the second electrodes of the second capacitors are coupled to form a second sensing line. The method comprises sensing, by a sensing unit, a voltage level representing the amount of charge being present on the first sensing line and the second sensing line, applying, by a control unit, a drive signal to each of the switches being coupled to the first electrodes, wherein a specific weighting factor is assigned to each capacitor, wherein the capacitances of the first and the second capacitor of one sensing element corresponds to a constant capacitance value, wherein, in one integration cycle, a part of the switches being coupled to the first electrodes is closed so that a part of the first capacitors is driven by a first drive signal and a part of the switches being coupled to the second electrodes is closed so that a part of the second capacitors is driven by a second drive signal, wherein the sensing unit is adapted to sense the voltage level representing the sum of the amount of charge of the part of the first capacitors and the voltage level representing the sum of the amount of charge of the part of the second capacitors, and determining, by the control unit, the position of the object in one dimension by analyzing the results of a plurality of sensed voltage levels for the first capacitors and the second capacitors of a plurality of integration cycles.

According to a further exemplary embodiment, a computer-readable medium is provided, in which a computer program of determining the position of an object is stored, which computer program, when being executed by a processor, is adapted to carry out or control a method having the above mentioned features.

According to still another exemplary embodiment, a program element (for instance a software routine, in source code or in executable code) of determining the position of an object e is provided, which program element, when being executed by a processor, is adapted to carry out or control a method having the above mentioned features.

Determining the position of an object, which may be performed according to embodiments of the invention, can be realized by a computer program that is by software, or by using one or more special electronic optimization circuits, that is in hardware, or in hybrid form, that is by means of software components and hardware components.

The invention relates to position sensing devices. Particularly, the invention is related to position sensors utilizing capacitive proximity sensing.

More specifically, the invention describes a capacitive position sensor that can determine the position of a finger or a stylus on a non conducting surface in a one- or two-dimensional plane. Capacitance measurement may be implemented utilizing a switched capacitor integrator principle. According to this, a switched-capacitor filter structure is utilized for the implementation of a capacitance measurement function.

A sensing element may be implemented by using a proximity sensing capacitor being operated in a switched capacitor integrator configuration with the purpose of measuring the capacitance of the sensing capacitor. The sensor capacitor may be formed by two electrodes attached to a substrate. The electrodes may be very thin (3-50 μm) and very narrow (50-100 μm) and may have rounded edges. As a consequence, the direct plate capacitance of the sensing capacitor may be small compared to its fringe capacitance. An object, like a human finger, in close proximity with the substrate may cause a distortion of the fringe field of the sensing capacitor. This distortion may reduce the capacitance of the sensing capacitor.

According to this embodiment, assuming three parallel capacitors, the capacitance of two paralleled sensing capacitors out of the three sensing capacitors may be measured during one measurement instead of just one sensing capacitor as described in the prior art. As a consequence every measurement may yield the sum of two out of three sensor capacitances. Summing in this case may act as a FIR low-pass filter meant to remove high frequent noise like high frequent carrier residues in smartcard applications. Thus, the noise filtering may be carried out during one measuring or integration cycle and no further noise filter cycle may be needed.

By using two capacitors per sensing element, a weighted summing function may be implemented. This is the core of the center-of-gravity position calculation algorithm. A direct implementation of the weighted summing function may reduce the requirement for drive signals to two in one direction, resulting in a faster generation of position data and enabling higher position data sample rates. Using the weighted summing function for a one-dimensional sensor system may lead to an efficient and fast determination of the position of the object in a one-dimensional plane.

In the following, further exemplary embodiments of the capacitive position sensor system will be explained. However, these embodiments also apply to the electronic device, the determination method, to the program element and to the computer-readable medium.

Analyzing the results of a plurality of sensed voltage levels may comprise computing the charge of each of the first capacitors and second capacitors. As per integration cycle the sum of the charges of more than one capacitor is measured, it might be needed to compute the charges per capacitor.

The sensing unit and the control unit may provide an n-tap FIR noise filter by driving at least two capacitors in one integration cycle, in particular by closing at least two switches.

The sampling method and system disclosed herein may economically implement position data sampling and noise filtering by implementing n-tap FIR noise filter support directly into the switched capacitor measurement unit. Together with a digital post-processing, an n-tap FIR function may be implemented. The implemented noise filtering may reduce the effort for separate data sample filtering, resulting in a speed advantage compared to prior art implementations.

The second electrodes of the first capacitors may be arranged equally spaced between the second electrodes of the second capacitors.

This arrangement of the electrodes may provide an optimized interleaving of both sensor capacitors. Based on such an arrangement, the size of the sensor device may be reduced being beneficial for smart cards or other small devices.

The number of integration cycles may correspond to the number of the first or second capacitors. In each integration cycle, the combination of the sensed or measured capacitors may change. After the sampling or measuring, the charge for each single capacitor may be determined.

The sensing unit may comprise an integration capacitor being indicative for the sum of the amount of charge of the part of the first capacitors and the second capacitors, and a comparator for comparing the voltage level sensed via the integration capacitor with a reference voltage.

The switches may be in conjunction with the sensing elements or capacitors of the sensing elements configured to periodically charge and discharge the integration capacitor. The amount of charge being coupled through the capacitors of the sensing elements into the integration capacitor may depend on the capacitance of the capacitors of the sensing elements and the actual voltage across the integration capacitor. The amount of charge being removed from the integration capacitor may depend on the capacitance of the capacitors of the sensing elements and may be independent of the actual voltage across the integration capacitor.

Parasitic capacitances of connection nodes being coupled to the integration capacitor between the capacitors of the sensing elements and the sensing line may be used as a fly capacitor during charging and/or discharging.

In the charging step and the reverse (discharging) step, the parasitic capacitance of a node (S) of the sensing line, $C_{pars}$, and the parasitic capacitances of a node (Z) of the connection between the integration capacitor and the capacitors of the sensing elements, $C_{parz}$, may be combined into a total parasitic capacitance $C_{par}=C_{parz}+C_{pars}$. The sensing capacitor $C_s$ and the combined parasitic node capacitance of node Z and node S, $C_{par}$, are connected in parallel. They may be used as a fly capacitor in a switched capacitor filter configuration. The charge being moved into the integration capacitor $C_{int}$ may be in good approximation $\Delta Q_{cint} \sim (V_{cc}-V_{cint})*(C_s+C_{parz}+C_{pars})$. The charge being removed from the integration capacitor $C_{int}$ during the reverse step may be in good approximation $\Delta Q_{cint} \sim V_{cc}*C_s$. Discharging may be independent of the voltage across the integration capacitor and can be regarded as a touch-dependent current that discharges the integration capacitor. If added and removed charging of the capacitor is equal in size, the integration capacitor voltage might not increase any further. This voltage $V_{cint\_max}$ may be in good approximation $V_{cint\_max}=V_{cc}*(C_{parz}+C_{pars})/(C_s+C_{parz}+C_{pars})$. The combined parasitic capacitance $C_{par}$ should be as small as possible in order to achieve a good sensor sensitivity.

The comparator may be a general purpose input/output pin being controlled as a comparator and/or a voltage comparator.

Each of the switches may be a general purpose input/output pin being controlled as a switch.

Many modern consumer devices are equipped with powerful micro controller units (MCU) that offer a plurality of general purpose input/output interfaces or pins (GPIO). In many applications, not all of the many GPIOs are utilized by the application and may be made available for the implementation of a touch sensing algorithm.

A common capacitive proximity sensor device applies a pseudo dual slope integration scheme wherein the integration capacitor is charged in a switched capacitor integrator scheme to a negative voltage and discharged by a resistor to zero voltage. A timer determines the time required to discharge the capacitor. Due to the nature of integrated circuits the negative voltage level across the integration capacitor has to stay well below the threshold voltage of the implemented input protection diode to ground as otherwise the diode would start to conduct and unwanted discharge would occur. This behavior limits the integration voltage level and hence the signal to noise ratio and hence this implementation is not well suited for a GPIO-based implementation.

Another common capacitive proximity sensor device applies single charge transfer action that charges an integration capacitor through the sensing capacitor. In fact, due to undocumented parasitic effects the integration capacitor approaches an operation point where the added charge is equalized by parasitic effects which prohibits a further increase of the integration voltage. This behavior is not well suited for a GPIO-based implementation as it limits the available drive range too much.

As already mentioned, by using two capacitors per sensing element, a weighted summing function may be implemented. This is the core of the center-of-gravity position calculation algorithm. A direct implementation of the weighted summing function may reduce the requirement for drive signals to two in one direction, resulting in a faster generation of position data and enabling higher position data sample rates.

Using the weighted summing function for a one-dimensional sensor system may lead to an efficient and fast determination of the position of the object in a one-dimensional plane. In one embodiment, the first capacitors of one set of sensing elements are weighted increasingly in one direction and the second capacitors of this set of sensing elements are weighted in an inverted way, i.e. are weighted decreasingly in the same direction.

The first capacitors may be interconnected on a first layer and the second capacitors may be interconnected on a second layer.

According to this embodiment, a two-layer structure may be used for the capacitive position sensor system. By having the capacitors arranged on two overlaying layers, the size of the sensor system may be minimized. Further, as the first capacitors are interconnected on a first layer and the second capacitors are interconnected on a second layer, via-connections being otherwise required from the first layer to the second layer may thus be reduced.

The capacitive position sensor system may further comprise a dummy capacitor being adapted to equalize the parasitic capacitance of each sensor capacitor node to AC ground.

This dummy capacitor may be used for matching parasitic wiring capacitances. Matching may be required if due to layout constraints the parasitic capacitance of the sensor capacitor electrodes to AC ground differ. By adding additional tracks connected to AC-ground, dummy capacitors are introduced that may compensate differences in parasitic capacitances.

AC ground may be nodes, which are connected to ground or a supply like Vcc, for instance also logic outputs of circuits having a temporal high or low level, for instance the lines connecting the capacitors to the voltage supply.

The set of sensing elements may be arranged surrounded by a guard fence electrode being adapted to provide a reference ground.

In particular in a contactless mode, a reference ground may be required for providing a ground potential for the capacitors. This may be achieved by a guard fence electrode being arranged around the set of sensing elements.

The set of sensing elements may correspond to one column and the capacitive position sensor system may comprise a plurality of sets of sensing elements being arranged parallel to each other in order to form a two-dimensional sensor system.

Combining multiple weighted one-dimensional sensors may result in a two-dimensional sensor system. The plurality of one-dimensional sensing elements may be arranged in columns to form a two-dimensional array with the position within a row being determined by applying a center of gravity calculation. The resulting two-dimensional sensor may have a hardware implemented summing and averaging in column direction and a software based summing and averaging in row direction. This may provide a good cover of the sensitive area without the need for many drive signals.

By using more than one set of sensing elements, a two-dimensional sensor system may be provided. Each set of sensing elements may be driven by one driving signal. Thus, the number of needed driving signals may correspond to the number of the dimension.

In order to increase the sensitivity of the sensor the capacitance measurement for a combination of capacitors is repeated multiple times instead of increasing the integration capacitor Cint. The results of the individual capacitance measurements are summed up and averaged with the consequence that average measurement gain increases and Gaussian noise is effectively reduced.

In order to reduce the time required to execute all capacitance measurements required to determine the objects position the position determination may be split up into a determination of the position in a first dimension and a subsequent determination of the position in a second dimension wherein the result of the position determination in the first dimension may be used to reduce the amount of measurements required to determine the position in the second dimension.

In the following, further exemplary embodiments of the electronic device will be explained. However, these embodiments also apply to the capacitive position sensor system, the determination method, to the program element and to the computer-readable medium.

The electronic device may be a smart card, a mobile device or a keypad. Due to the low energy consumption based on the fact that less drive signals are needed, the capacitive position sensor system may be used for many applications having strict place or energy requirements. The herein described capacitive position sensor system may require less I/O ports and less external components compared to common one- and two-dimensional sensors based on matrixed arrays and can be implemented utilizing standard GPIOs, which may also allow to integrate the system into a smart card or keypad.

The capacitive position sensor system may be integrated in a secure element of the electronic device. The integration of position detection devices in security relevant target systems may have the disadvantage that interfacing signals have to be connected from the position sensing device to a secure element to deliver the position information. The position information might be security relevant, e.g., authentication information like online handwriting information that must not be intercepted by unauthorized thirds.

The capacitive position sensor system may be implemented in a security relevant environment. In order to prevent interception of position information the touch sensing circuitry may be part of a secure element.

In the following, further exemplary embodiments of the method will be explained. However, these embodiments also apply to the capacitive position sensor system, the electronic device, to the program element and to the computer-readable medium.

The set of sensing elements may correspond to one column and the capacitive position sensor system may comprise a plurality of sets of sensing elements being arranged parallel to each other in order to form a two-dimensional sensor system, and the method may further comprise determining, by the control unit, the position of the object in a second dimension by analyzing the results of a plurality of sensed voltage levels for the first capacitors and the second capacitors of a plurality of integration cycles being determined for the first dimension.

By using more than one set of sensing elements, a two-dimensional sensor system may be provided. Each set of sensing elements may be driven by one driving signal. Thus, the number of needed driving signals may correspond to the number of the dimension. In order to reduce the time required to execute all capacitance measurements required to determine the objects position, the position determination may be split up into a determination of the position in a first dimension and a subsequent determination of the position in a second dimension.

The determination of the position in the second dimension may comprise analyzing the sensing elements being relevant for the first dimension.

According to this embodiment, the result of the position determination in the first dimension may be used to reduce the amount of measurements required to determine the position in the second dimension.

The aspects defined above and further aspects of the invention are apparent from the examples of embodiment to be described hereinafter and are explained with reference to these examples of embodiment.

BRIEF DESCRIPTION OF THE DRAWINGS

The invention will be described in more detail hereinafter with reference to examples of embodiment but to which the invention is not limited.

DESCRIPTION OF EMBODIMENTS

Figure 1:
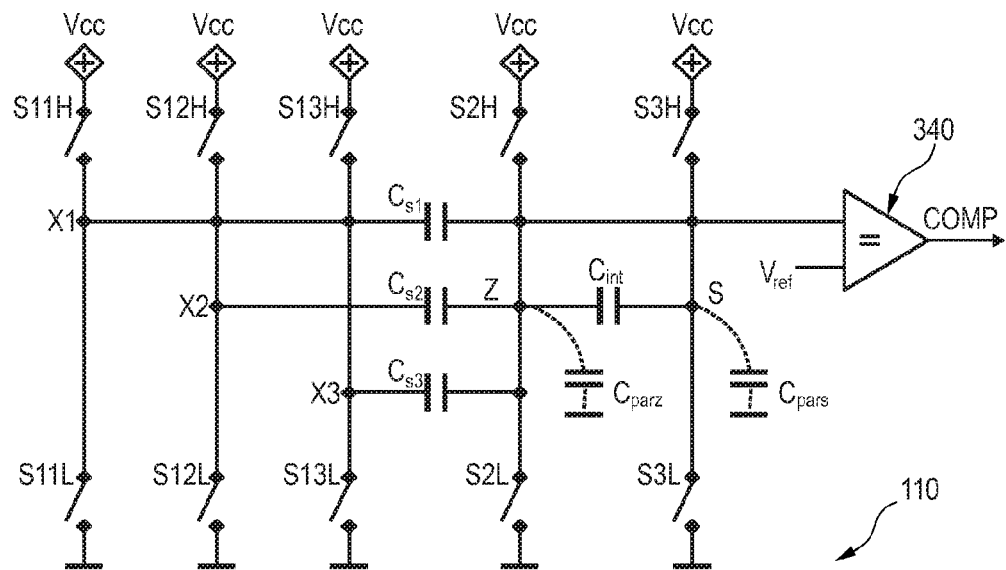
FIG. 1 illustrates a capacitive position sensor system according to an exemplary embodiment of the invention.

The illustration in the drawing is schematically. In different drawings, similar or identical elements are provided with the same reference signs.

Exemplary embodiments of the present invention will be described below. In an effort to provide a concise description of these exemplary embodiments, implementation details which fall into the customary practice of the skilled person may not have been described. It should be appreciated that in the development of any such implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill.

According to the herein described system and method, techniques are provided for an economic implementation of one- and two-dimensional tactile user interfaces in a mobile device. In some embodiments, the system and method utilizes a set of general purpose input output ports (GPIO) of a standard microcontroller unit (MCU) integrated into said device and at least one integration capacitor. A switched-capacitor filter structure is utilized for the implementation of a capacitance measurement function. If not otherwise mentioned a DC supply voltage named Vcc is assumed to be applied to the circuitries described herein.

FIG. 1 illustrates a capacitive position sensor system 100. This sensor system may also be called in the following complementary sampling unit. In the example given here, three sensor capacitors Cs1, Cs2 and Cs3 each representing a sensing element are used. Complementary sampling may be implemented with a suitable number of sensing capacitors that should be larger than one. The circuit may also be configured such that two or any other number up to two less than the available sensing capacitors are not selected. The circuit illustrated by FIG. 1 may be used for exemplary explanation of the functional principle wherein this embodiment is configured to measure the capacitance of two paralleled sensing capacitors out of the three sensing capacitors during one measurement (or integration cycle) instead of just one sensing capacitor as it is the case in common systems. As a consequence every measurement yields the sum of two out of three sensor capacitances. Summing in this case acts as a FIR low-pass filter meant to remove high frequent noise like high frequent carrier residues in smart-card applications. If switch S3L is closed the voltage comparator 101 is used to compare the voltage across Cint with a suitable reference voltage Vref. Vref may also be the trip point voltage of a GPIO input buffer. In the following Figures, X may refer to a driving node to which the driving signal may be applied, Z may refer to a sensing node where the voltage may be sensed and S may refer to a switching node. In FIG. 1, all sensing capacitors Cs are coupled to a driving node, wherein a driving signal is present at these nodes, if the correspondent switches S1$i$H and S1$i$L are closed.

Figure 2:
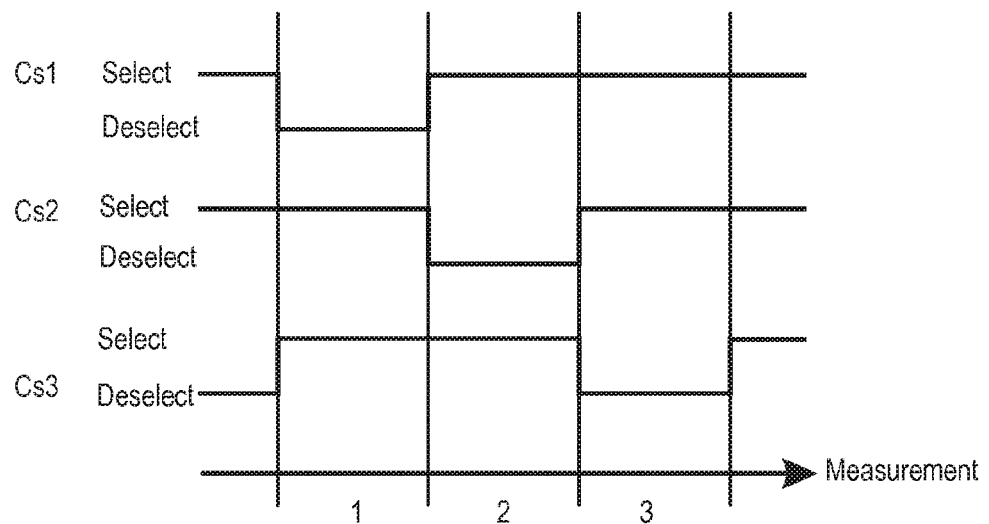
FIG. 2 illustrates a timing diagram indicating the sensor capacitor selection in the system of FIG. 1.

FIG. 2 is a simplified timing diagram illustrating the logical selection of sensor capacitors in a complementary sampling unit as illustrated by FIG. 1. The complementary sampling unit performs in this example a sequence of three measurements as depicted by FIG. 2 wherein each of the sensor capacitors is not selected during one measurement interval. After one complete measurement sequence comprising three measurements, the capacitance of each sensor may be retrieved by a set of arithmetic calculations.

Figures 3, 4:
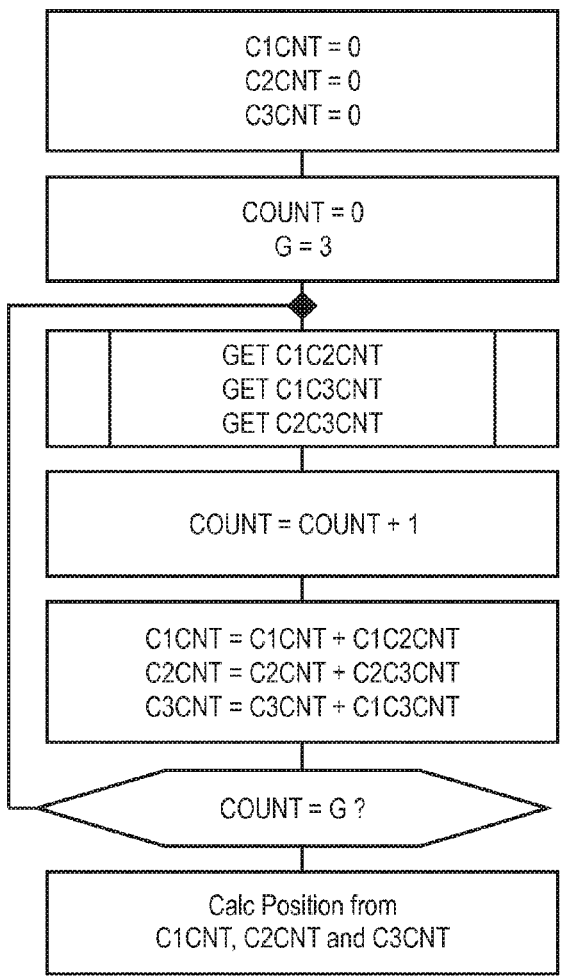
FIG. 3 illustrates various functional steps being executed in the system of FIG. 1.
FIG. 4 illustrates various functional steps being executed in the system of FIG. 1 as required to implement multiple measurements of the same capacitor combinations.

The example below indicates the calculation process for a complementary sampling unit with three sensor capacitors and with two sensor capacitances being measured at the same time:

Measurement 1 yields $\Sigma 1 = Cs2 + Cs3$
Measurement 2 yields $\Sigma 2 = Cs1 + Cs3$
Measurement 3 yields $\Sigma 3 = Cs1 + Cs2$ The capacitance of every sensing capacitor may be retrieved by:

$\Sigma tot = \Sigma 1 + \Sigma 2 + \Sigma 3$
$Cs1 = \Sigma tot/2 - \Sigma 1$
$Cs2 = \Sigma tot/2 - \Sigma 2$
$Cs3 = \Sigma tot/2 - \Sigma 3$ FIG. 3 illustrates in detail the functional steps that may be required to execute a capacitance measurement in a complementary sampling unit according to the embodiment illustrated by FIG. 1. The table indicates when the involved switches S11H, S11L, S12H, S12L, S13H, S13L, S2H, S2L, S3H and S3L have to be closed. A closed switch is indicated by an "X". A measurement sequence starts with the definition of the initial integration condition in step A by resetting the loop counter CsiCsjCNT and in step B by resetting the integration capacitor Cint. After that, the steps B, C, D, E, F, G, H and J are periodically executed until a measurement G results in an integration voltage above a predefined voltage threshold which concludes the actual measurement. After that, the counters CsiCsjCNT are read and the results are provided to an invoking software routine for further processing. Next to that, a new measurement is started with a different combination of sensing capacitors.

FIG. 4 illustrates in detail the functional steps that may be required to implement a one-dimensional position determination that may be based on the exemplary measurement routine as indicated by FIG. 3. The initial conditions may be set by resetting the three counters CiCNT. A loop counter COUNT may be used to count the amount of repeated measurements performed. This counter COUNT is reset. A parameter G may define the amount of measurement repetitions. After setting the initial conditions repeated cycles are executed comprising a measurement sequences with three measurements each in this example are executed, yielding activity levels for each capacitance under test, and summing up the activity levels. These cycles are repeated as many times as indicated by the parameter G. After that, the position is calculated from the accumulated activity levels applying the required algorithm which may be individual for every dimension.

Figure 5:
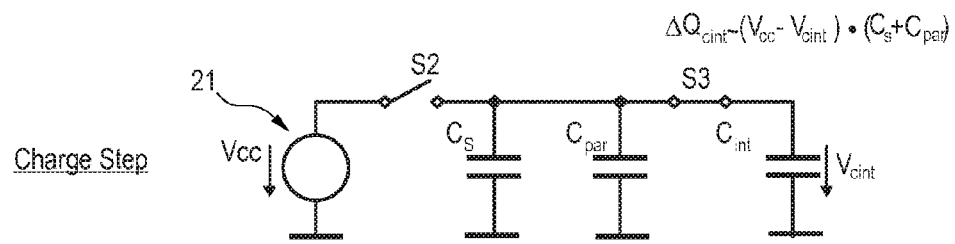
FIGS. 5 and 6 illustrate the charge transport to and from the integration capacitor during the charge step and the reverse step according to FIG. 1.
Figure 6:
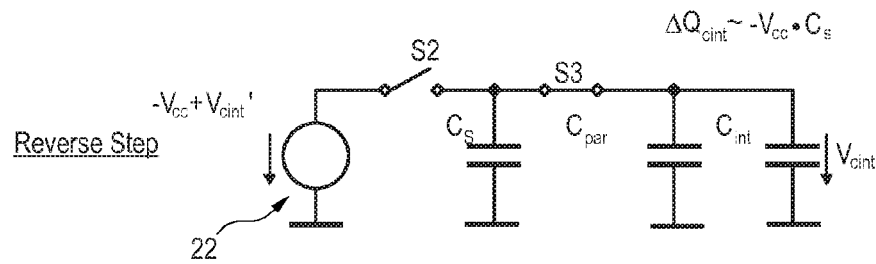

FIGS. 5 and 6 illustrate the charging step (FIG. 5) and the reverse step (FIG. 6). With reference to FIG. 1, the parasitic capacitance of node S, Cpars, and the parasitic capacitances of node Z, Cparz, are combined into a total parasitic capacitance Cpar=Cparz+Cpars for simplification in further considerations. As can be seen, the sensing capacitor Cs and the combined parasitic node capacitance of node Z and node S, Cpar, are connected in parallel. They are used as a fly capacitor in a switched capacitor filter configuration. The charge being moved into the integration capacitor Cint is in good approximation ΔQcint~(Vcc−Vcint)*(Cs+Cparz+Cpars). The charge being removed from the integration capacitor Cint during the reverse step is in good approximation ΔQcint~Vcc*Cs. Discharging is independent of the voltage across the integration capacitor and can be regarded as a touch-dependent current that discharges the integration capacitor. If added and removed charging of the capacitor is equal in size, the integration capacitor voltage will not increase any further. This voltage Vcint_max is in good approximation Vcint_max=Vcc*(Cparz+Cpars)/(Cs+Cparz+Cpars). The combined parasitic capacitance Cpar should be as small as possible in order to achieve a good sensor sensitivity. Reference numbers 21 and 22 represent virtual voltage sources.

Figure 7:
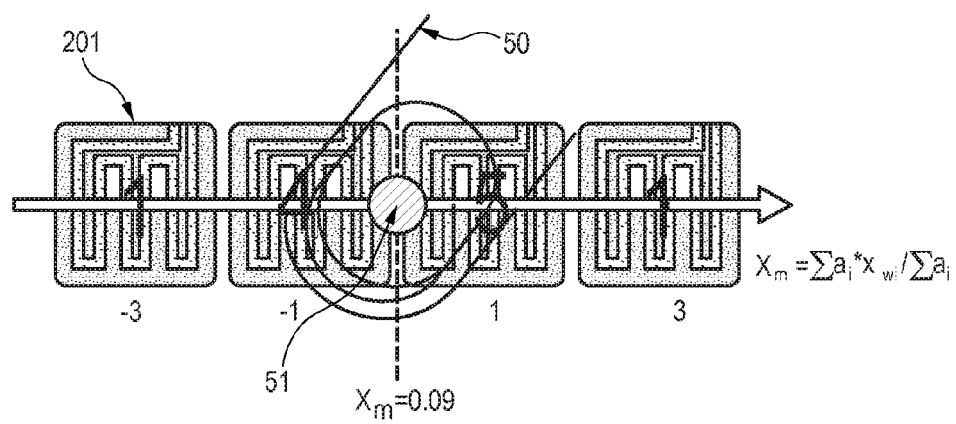
FIG. 7 illustrates the application of the center of gravity principle on a horizontal slider configuration made from four proximity sensing capacitors, according to an embodiment of the invention.

FIG. 7 illustrates a method of evaluating a position in a one-dimensional plane by applying a modified center of gravity formula. The embodiment shown in FIG. 7 is based on a horizontal slider with four sensing capacitors. The capacitances are measured using a complementary sampling unit illustrated by FIG. 15. If a human finger 50 is in close proximity to the sensor array 201, capacitance deviations of the sensor capacitors are measured. These measurement results represent activity levels that are related to the strength of the capacitance variation. These activity levels are multiplied with the sensors position weight factors in X-direction. According to the herein described system and method, the origin of the X-weight-scale is positioned exactly in the middle of the sensor array 201, which avoids asymmetric noise contributions. The X-position is calculated from the four activity levels ai:

$$Xm = \Sigma ai * Xwi / \Sigma a$$

Figure 8:
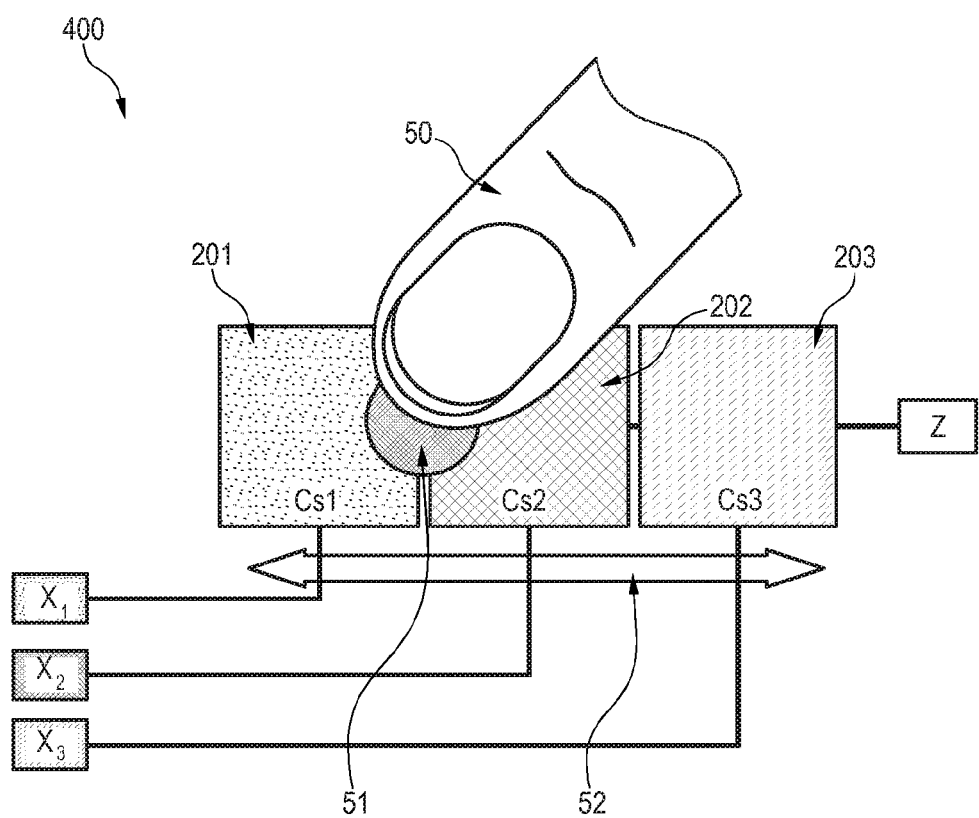
FIG. 8 illustrates an embodiment of a one-dimensional position sensor based on the system illustrated by FIG. 1.

FIG. 8 illustrates an embodiment of a one-dimensional slider based on the complementary sampling unit according to FIG. 1. The sensor array 400 comprises three un-weighted sensor capacitors 201, 202 and 203. The touch position 51 caused by a finger 50 in close proximity is calculated applying the principles illustrated by FIG. 7. By determining consecutive touch positions 51 a sliding movement 52 may be detected.

Figure 9:
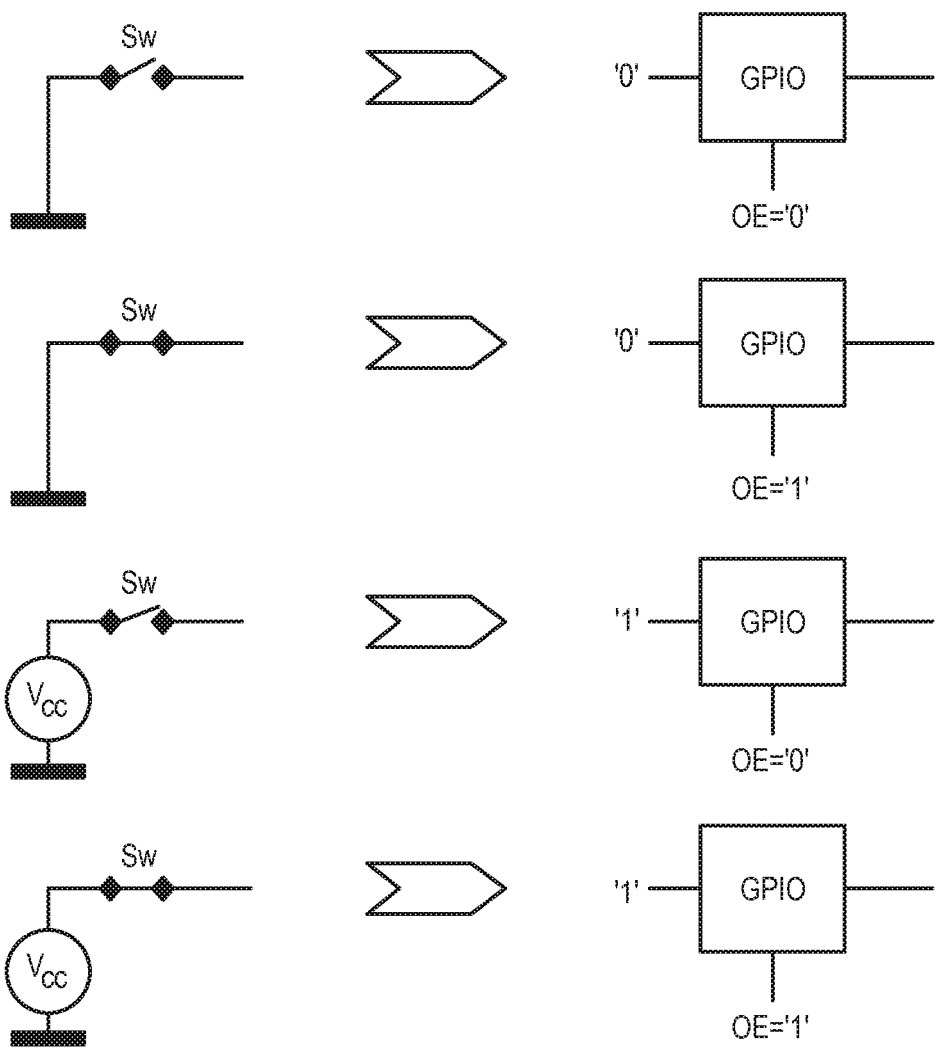
FIG. 9 illustrates GPIOs used as switches connected to ground or to the DC supply voltage, according to an embodiment of the invention.

FIG. 9 illustrates how switches in switched capacitor integrators that may be connected to ground or to the DC supply voltage can be substituted by GPIOs. An open switch may be implemented by a GPIO with the output being switched to tri-state (high-impedance), OE='0'. A closed switch connected to ground may be implemented by a GPIO with its output being enabled (OE='1') and the input value being set to a logic "LOW"-level. A closed switch connected to digital supply voltage level is implemented by a GPIO with its output being enabled and the input value being set to a logic "HIGH"-level.

Figure 10:
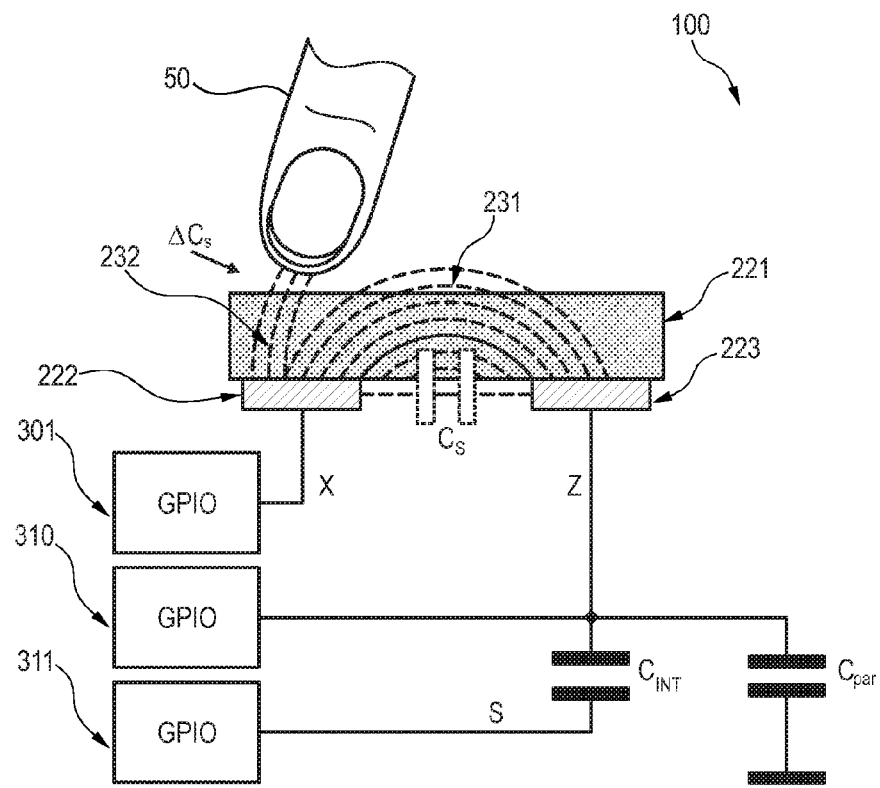
FIG. 10 illustrates an embodiment of a capacitance measurement circuit for capacitive proximity sensors based on a GPIO controlled switched capacitor filter, according to an embodiment of the invention.

FIG. 10 illustrates a proximity sensing capacitor Cs in a sampling unit 100 being operated in a switched capacitor integrator configuration with the purpose of measuring the capacitance of the sensing capacitor Cs. The sensor capacitor Cs is formed by two electrodes 222 and 223 attached to a substrate 221. The electrodes 222 and 223 are very thin (3-50 µm) compared to the thickness of the substrate 221 (200-1000 µm). As a consequence the direct plate capacitance of the capacitor Cs is small compared to its fringe capacitance. The fringe field of capacitor Cs is indicated by 231. A human finger in close proximity with the substrate 221 causes a distortion 232 of the fringe field. This distortion reduces the capacitance of the sensing capacitor Cs. GPIO 301, 310 and 311 are in conjunction with the sensing capacitor Cs configured to periodically charge and discharge the integration capacitor Cint. The amount of charge being coupled through the sensor capacitor Cs into the integration capacitor depends on the capacitance of the sensor capacitor Cs and the actual voltage across the integration capacitor and the amount of charge being removed from the integration capacitor depends on the capacitance of the sensor capacitor and is independent of the actual voltage across the integration capacitor Cint. The combined parasitic capacitance at node Z and node S caused e.g. by wiring capacitances or the output capacitances of GPIO 310 and GPIO 311 respectively are here considered by the capacitor Cpar. During charging of Cint the capacitor Cpar may be regarded as being in parallel to the sensing capacitor. With increasing voltage across the integration capacitor Cint less charge is coupled to the integration capacitor.

Figure 11:
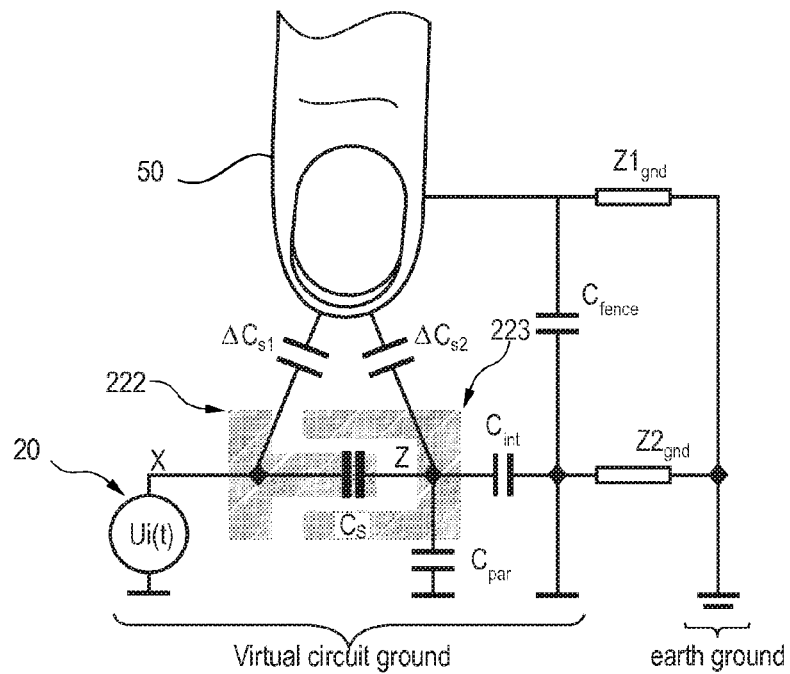
FIG. 11 illustrates the capacitances being present when a human finger is in close proximity to a sensor capacitor, according to an embodiment of the invention.

FIG. 11 is a simplified model of a capacitive sensor touched by a human finger 50. The capacitance variation caused by the finger is illustrated by the capacitors ΔCs1 and ΔCs2. The capacitor Cint is the integration capacitor. The capacitor Cfence represents the capacitance between the finger 50 and a guard fence structure indicated by 240 in FIG. 13. The impedance Z1gnd from the human body to earth ground potential and the impedance Z2gnd from earth ground potential to the sensors circuit ground model the back current loop for ΔCs1 and ΔCs2. The sum of Z1gnd and Z2gnd represents a high impedance related to the impedance of ΔCs1 and ΔCs2 which causes a reduction of measurement sensitivity. In order to improve the measurement sensitivity for contactless applications a parallel back current path through Cfence is established. The capacitor Cfence may develop between a human finger 50 and a guard fence electrode as indicated by reference number 240 in FIG. 13, enclosing the sensor structure. Reference number 20 illustrates a X driver source.

Figure 12:
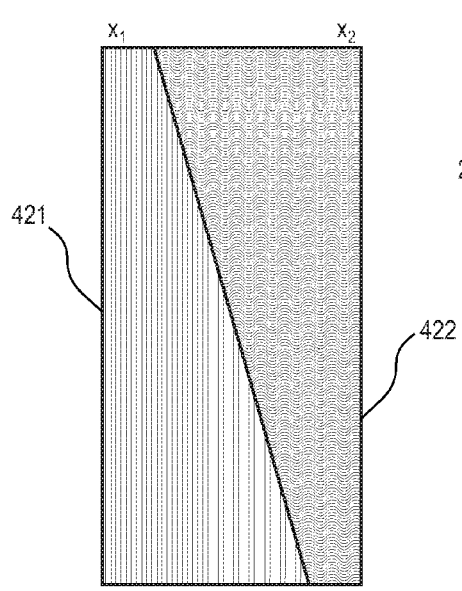
FIG. 12 illustrates the linear weighting principle of a one-dimensional position sensor with two discretely weighted capacitors.
Figure 13:
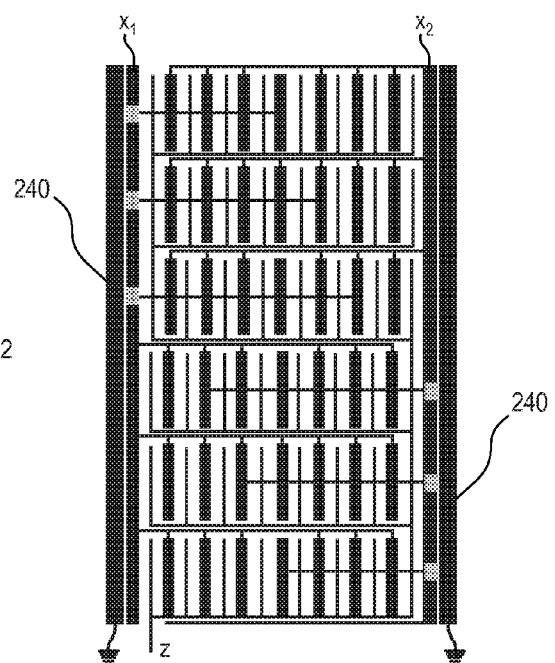
FIG. 13 illustrates an embodiment of a one-dimensional position sensor created from two weighted sensor capacitors, according to an embodiment of the invention.

FIG. 13 illustrates a weighted sensor element according to FIG. 12. In the configuration according to FIG. 13, all first weighted sensor capacitors are connected to signal Cx1, all second weighted sensor capacitors are connected to signal Cx2. Measuring all first weighted and all second weighted capacitors may allow a precise determination of the relative touch position. The six discretely weighted sensor capacitors may form in a sufficient approximation a linear weighting with the capacitance between node X1 and node Z increasing from top to bottom and the capacitance between node X2 and node Z decreasing from top to bottom. The activity levels derived from measurements at the nodes X1 and X2 represent a scaled weighted average of all sensor capacitor activity levels connected to the same node. Normalization is achieved during the position calculation by dividing the activity levels of the sensor capacitors between node X1 and Z and between node X2 and Z the sum of the activity levels of all sensor capacitors:

x=Cx1/(Cx1+Cx2)

1−x=Cx2/(Cx1+Cx2)

x represents the relative position in x-direction and (1−x) represents the complementary x position. According to the herein described method and system, the position x is for numerical precision calculated from the larger of the two values Cx1 and Cx2.

Figure 14:
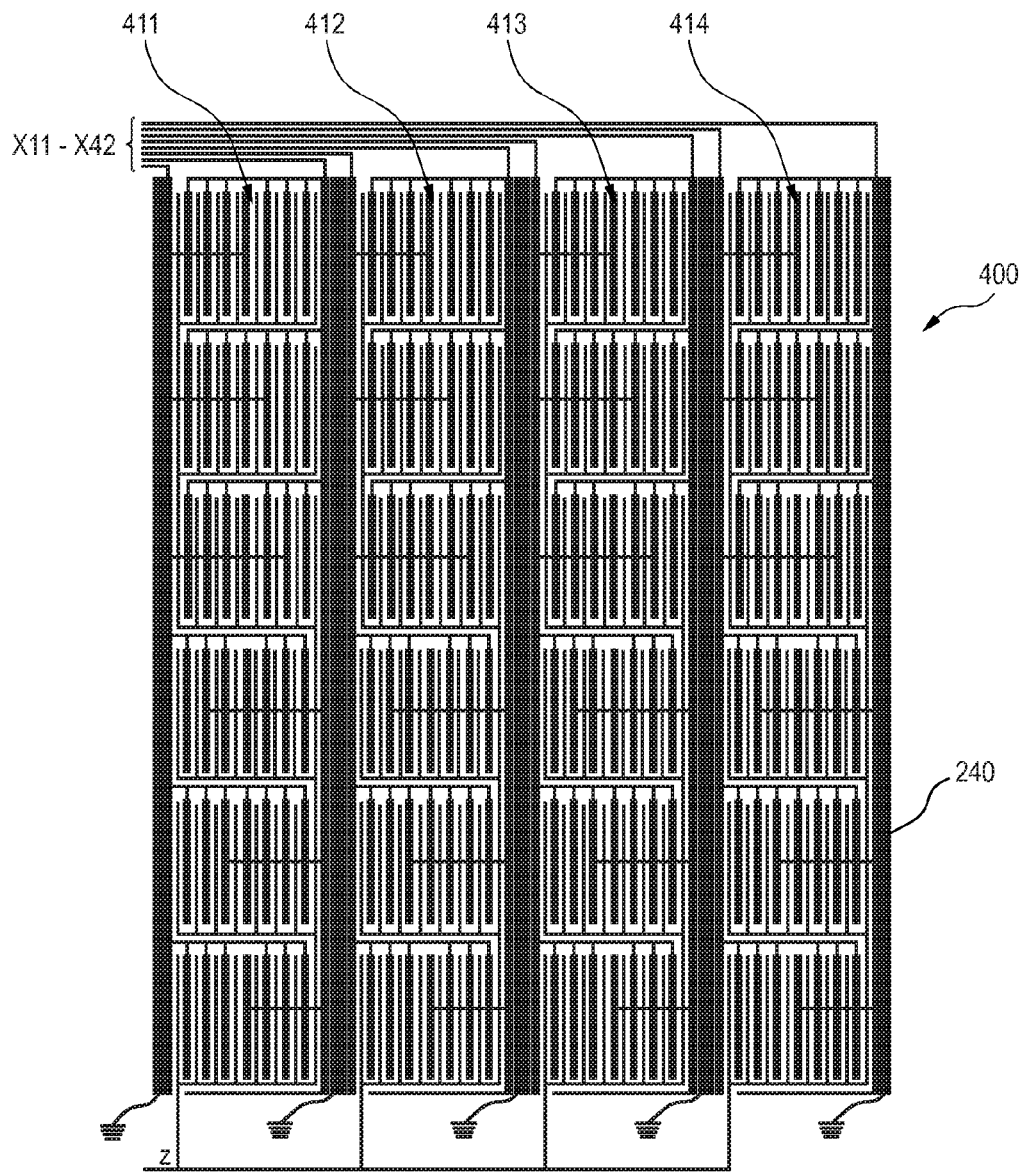
FIG. 14 illustrates an embodiment of a two-dimensional position sensor created from four one-dimensional sensor elements according to FIG. 13 with weights implemented by interleaved unit sensor capacitors, according to an embodiment of the invention.

FIG. 14 illustrates a two-dimensional position sensor according to the invention. It is one idea of the herein described method and system to simplify the implementation of two-dimensional position sensing devices. In order to reduce the amount of GPIOS required for the sensor implementation, the weights being applied by the center of gravity algorithm are partially applied to the sensor structure by implementing weighting and summing directly. The sensor array 400 in FIG. 14 comprises multiple weighted sensor elements 411, 412, 413 and 414 with each of these weighted sensor elements 411, 412, 413 and 414 comprising two weighted sensor capacitors, which in the depicted embodiment of FIG. 12 are the sensor capacitors 421 and 422. However, each sensor element may also comprise more than two capacitors.

Figure 15:
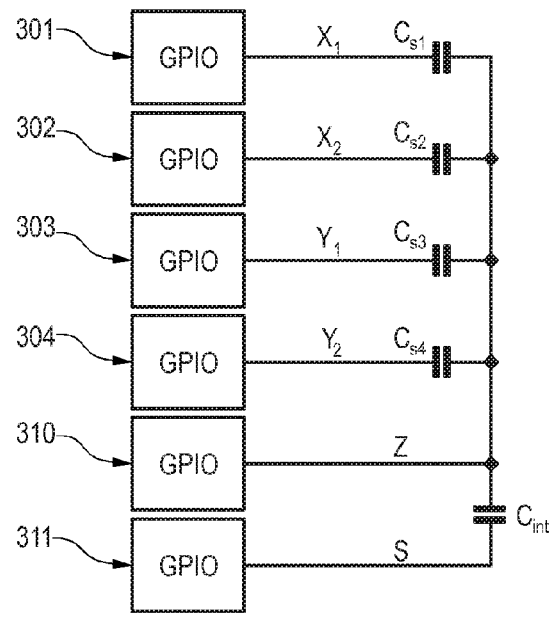
FIG. 15 indicates the GPIO structure being used to implement a one-dimensional position sensor utilizing the sensor structure of FIG. 7.

FIG. 15 illustrates an embodiment of a complementary sampling unit with four sensor capacitors. The GPIOs 301-304, 310 and 311 are configured to implement one-dimensional and two-dimensional position detectors.

Figure 16:
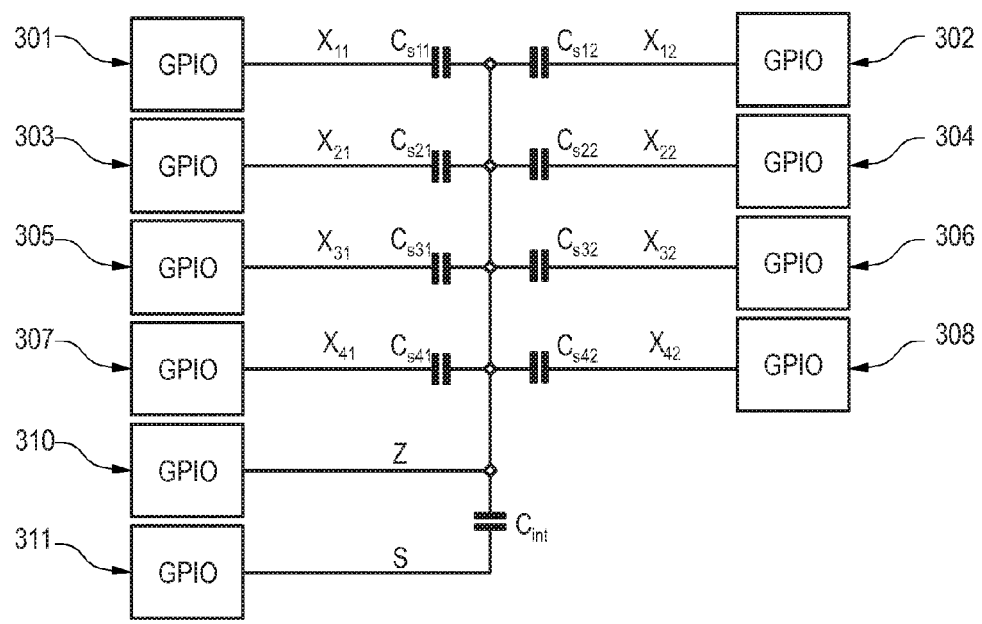
FIG. 16 illustrates the GPIO structure being used to implement a two-dimensional position sensor utilizing the sensor structure of FIG. 14.

FIG. 16 illustrates an embodiment of a complementary sampling unit with eight sensor capacitors. The GPIOs 301-308, 310 and 311 are configured to implement two-dimensional position detectors.

The herein described method and system may enable the creation of a low power, low complexity touch based user interfaces for a variety of applications.

Figure 17:
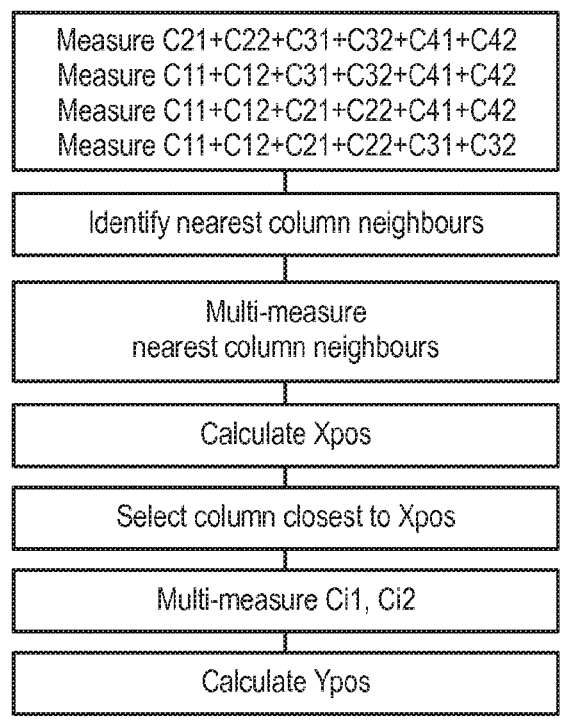
FIG. 17 illustrates the functional steps being required to determine a position utilizing a two-dimensional position sensor according to FIG. 14.

FIG. 17 depicts the functional steps that may be required to determine a position utilizing a two-dimensional position sensor according to FIG. 14. In a first step the position in a first dimension that may be in X direction is determined. To do so, the sensor array 400 of FIG. 14 is configured as a one-dimensional position sensor. The two weighted sensor capacitors of the weighted sensors 411, 412, 413 and 414 of FIG. 14 are connected in parallel, resulting in four sensor capacitors, each covering a vertical stripe of the total sensor area. Utilizing a complementary sampling unit indicated by FIG. 16 capacitance measurements are performed that may yield the sensor column providing the largest activity level. In a next step, multiple measurements are performed with the objective to measure the activity level of the identified sensor stripe and, if present, the two sensor stripes next to it. From the measurements of these three activity levels the X position is determined.

$Xm = \Sigma a_i * Xw_i / \Sigma a$ with $Xw_i$ representing the weights− 3,−1,1 and 3

In a next step the measurement setup is reconfigured. The previously identified column with the largest activity level is now used to determine the position in the second dimension which may be in Y direction. In this step, the two weighted sensor capacitors of a sensor column may now be evaluated separately multiple times. The Y position may be calculated by $y = a1/(a1+a2)$ or $1−y = a2/(a1+a2)$ wherein the calculation may be chosen that yields the best numerical precision.

Figure 18:
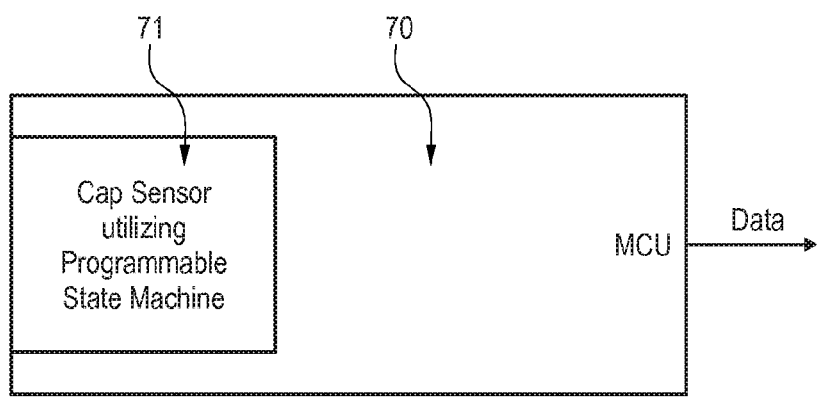
FIG. 18 illustrates an embodiment with the control unit of a two-dimensional position sensor being implemented by a programmable state machine of a MCU, according to an embodiment of the invention.
Figure 19:
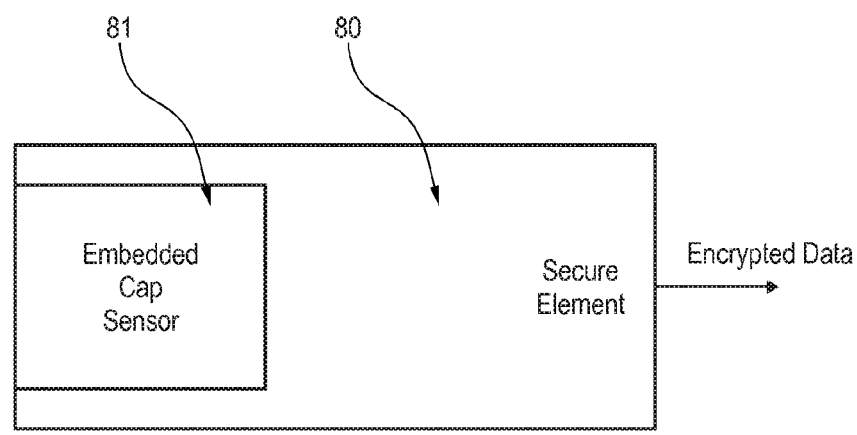
FIG. 19 illustrates an embodiment with the control unit of a two-dimensional position sensor being implemented as part of a secure element, according to an embodiment of the invention.

FIGS. 18 and 19 are embodiments that represent several implementations of the capacitive sensor interface. The capacitive sensor interface may be integrated into a MCU 80 with a programmable state machine 81. The integration of the capacitive sensor interface utilizing a programmable state machine offloads the CPU from timing critical tasks and furthermore reduces the power consumption of the MCU which is crucial for smartcard which are powered by the electromagnetic field of a reader device. In another embodiment, the capacitive sensor interface 81 may be integrated directly into a Secure Element 81 comprising a cryptographic processor. The integration of the capacitive proximity sensor interface into the Secure Element avoids insecure connections between a capacitive sensor device and a secure element. The output of the secure element is directly encrypted data.

Figure 20:
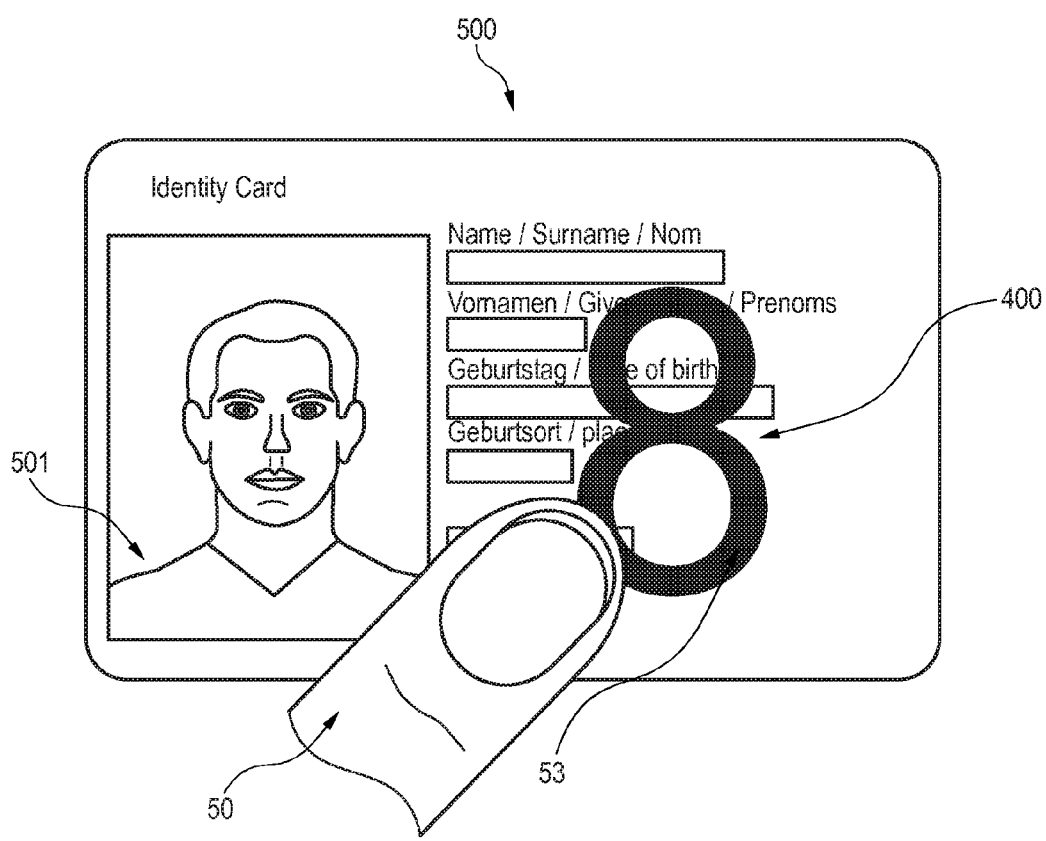
FIG. 20 illustrates an embodiment with the two-dimensional position sensor being implemented into an electronic ID card, according to an embodiment of the invention.

To suppress unauthorized communication with a contactless smartcard, a one-dimensional touch sensor interface may be embedded into a contactless smartcard. A two-dimensional position sensor according to FIG. 20 may be used to identify a number written by a human finger on the surface of the smartcard. This number may be part of a Personal Identification Number (PIN). The two-dimensional position sensor provides a stream of position data to an online-handwriting recognition that retrieves the entered digits. This approach may make external keypads obsolete and furthermore may avoid skimming the PIN on the way from the keypad to a host application since the PIN never leaves the smart card unencrypted. In this scenario, the PIN can either be entered via touch buttons that represent different characters or by gesture recognition where different gestures represent different characters. This authentication method is especially beneficial if an external secure keypad for PIN entry cannot be provided. The use case is quite common in secure online authentication, e.g., in online payment.

It should be noted that the term "comprising" does not exclude other elements or features and the "a" or "an" does

The invention claimed is:

1. A capacitive position sensor system for determining the position of an object, in particular on a surface of a contactless smartcard, wherein the object is positioned within a sensitive area of the capacitive position sensor system and changes the capacitance of sensing capacitors being arranged underneath the object, the capacitive position sensor system comprising
a set of sensing elements being arranged in the form of a column, each sensing element comprising a first sensing capacitor having a first electrode and a second electrode and a second sensing capacitor having a first electrode and a second electrode, wherein each first electrode is coupled via a switch to a voltage supply to form a switched capacitor filter, wherein the second electrodes of the first sensing capacitors are coupled to form a first sensing line and the second electrodes of the second sensing capacitors are coupled to form a second sensing line, wherein the electrodes of the first and second sensing capacitors are configured relative to a substrate such that a human finger in close proximity to the substrate causes distortion of a fringe field,
a sensing unit, wherein the sensing unit is adapted to sense a voltage level representing the amount of charge being present on the first sensing line and the second sensing line, and
a control unit, wherein the control unit is adapted to apply a drive signal to each of the switches being coupled to the first electrodes,
wherein a specific sensor position weighting factor is assigned to each sensing capacitor, wherein the capacitances of the first and the second sensing capacitor of one sensing element corresponds to a constant capacitance value, wherein the first sensing capacitors of the set of sensing elements are weighted with sensor position weighting factors that increase relative to each other in one direction along the column and the second sensing capacitors of this set of sensing elements are weighted with sensor position weighting factors that decrease relative to each other in the same direction along the column, wherein the sensor position weighting factor assigned to each sensing capacitor is a multiplier that is a function of the distance of the corresponding sensing capacitor from an origin,
wherein the control unit is adapted to, in one integration cycle, close a part of the switches being coupled to the first electrodes so that a part of the first sensing capacitors is driven by a first drive signal and close a part of the switches being coupled to the second electrodes so that a part of the second sensing capacitors is driven by a second drive signal, wherein the sensing unit is adapted to sense the voltage level representing the sum of the amount of charge of the part of the first sensing capacitors and the voltage level representing the sum of the amount of charge of the part of the second sensing capacitors,
wherein the control unit is adapted to determine the position of the object in one dimension by analyzing the results of a plurality of sensed voltage levels for the first sensing capacitors and the second sensing capacitors of a plurality of integration cycles, wherein analyzing the results of a plurality of sensed voltage levels comprises multiplying the sensor position weighting factor assigned to a sensing capacitor by a value corresponding to the sensed voltage level of the corresponding sensing capacitor and using the product of the multiplication to determine the position of the object.

2. The capacitive position sensor system according to claim 1, wherein analyzing the results of a plurality of sensed voltage levels comprises computing the charge of each of the first sensing capacitors and the second sensing capacitors.

3. The capacitive position sensor system according to claim 1, wherein the second electrodes of the first sensing capacitors are arranged equally spaced between the second electrodes of the second sensing capacitors.

4. The capacitive position sensor system according to claim 1, wherein the number of integration cycles corresponds to the number of the first sensing capacitors.

5. The capacitive position sensor system according to claim 1, wherein the sensing unit comprises an integration capacitor being indicative for the sum of the amount of charge of the part of the first sensing capacitors and the second sensing capacitors, and
a comparator for comparing the voltage level sensed via the integration capacitor with a reference voltage.

6. The capacitive position sensor system according to claim 5, wherein parasitic capacitances of connection nodes being coupled to the integration capacitor between the sensing capacitors of the sensing elements and the sensing line may be used as a fly capacitor during charging and/or discharging.

7. The capacitive position sensor system according to claim 1, wherein the first sensing capacitors are interconnected on a first layer and the second sensing capacitors are interconnected on a second layer.

8. The capacitive position sensor system according to claim 1,
further comprising a dummy capacitor being adapted to equalize the parasitic capacitance of each sensor capacitor node to AC-ground.

9. The capacitive position sensor system according to claim 1,
wherein the set of sensing elements are arranged surrounded by a guard fence electrode being adapted to provide a reference ground.

10. The capacitive position sensor system according to claim 1,
wherein the set of sensing elements corresponds to one column and wherein the capacitive position sensor system comprises a plurality of sets of sensing elements being arranged parallel to each other in order to form a two-dimensional sensor system.

11. The capacitive position sensor system according to claim 1, further comprising an electronic device, in particular a keypad, a smart card or a mobile device, for receiving an input from a user, wherein the input corresponds to the positioning of an object of the user.

12. A method of determining the position of an object, in particular on a surface of a contactless smartcard, wherein the object is positioned within a sensitive area of a capacitive position sensor system and changes the capacitance of sensing capacitors being arranged underneath the object,
wherein the capacitive position sensor system comprises a set of sensing elements being arranged in the form of a column, each sensing element comprising a first sensing capacitor having a first electrode and a second electrode and a second sensing capacitor having a first electrode and a second electrode, wherein each first electrode is coupled via a switch to a voltage supply to form a switched capacitor filter, wherein the second electrodes of the first sensing capacitors are coupled to form a first sensing line and the second electrodes of the second sensing capacitors are coupled to form a second sensing line, wherein the electrodes of the first and second sensing capacitors are configured relative to a substrate such that a human finger in close proximity to the substrate causes distortion of a fringe field, the method comprising sensing, by a sensing unit, a voltage level representing the amount of charge being present on the first sensing line and the second sensing line, applying, by a control unit, a drive signal to each of the switches being coupled to the first electrodes, wherein a specific sensor position weighting factor is assigned to each sensing capacitor, wherein the capacitances of the first and the second sensing capacitor of one sensing element corresponds to a constant capacitance value, wherein the first sensing capacitors of the set of sensing elements are weighted with sensor position weighting factors that increase relative to each other in one direction along the column and the second sensing capacitors of this set of sensing elements are weighted with sensor position weighting factors that decrease relative to each other in the same direction along the column, wherein the sensor position weighting factor assigned to each sensing capacitor is a multiplier that is a function of the distance of the corresponding sensing capacitor from an origin, wherein, in one integration cycle, a part of the switches being coupled to the first electrodes is closed so that a part of the first sensing capacitors is driven by a first drive signal and a part of the switches being coupled to the second electrodes is closed so that a part of the second sensing capacitors is driven by a second drive signal, wherein the sensing unit is adapted to sense the voltage level representing the sum of the amount of charge of the part of the first sensing capacitors and the voltage level representing the sum of the amount of charge of the part of the second sensing capacitors, and determining, by the control unit, the position of the object in one dimension by analyzing the results of a plurality of sensed voltage levels for the first sensing capacitors and the second sensing capacitors of a plurality of integration cycles, wherein analyzing the results of a plurality of sensed voltage levels comprises multiplying the sensor position weighting factor assigned to a sensing capacitor by a value corresponding to the sensed voltage level of the corresponding sensing capacitor and using the product of the multiplication to determine the position of the object.

13. The method according to claim 12, wherein the set of sensing elements corresponds to one column and wherein the capacitive position sensor system comprises a plurality of sets of sensing elements being arranged parallel to each other in order to form a two-dimensional sensor system, wherein the method further comprises determining, by the control unit, the position of the object in a second dimension by analyzing the results of a plurality of sensed voltage levels for the first sensing capacitors and the second sensing capacitors of a plurality of integration cycles being determined for the first dimension.

14. The method according to claim 13, wherein the determination of the position in the second dimension comprises analyzing the sensing elements being relevant for the first dimension.

\* \* \* \* \*